(12) United States Patent
De Roij et al.

(10) Patent No.: US 11,053,588 B2
(45) Date of Patent: Jul. 6, 2021

(54) PROGRAMMABLE DEPOSITION APPARATUS

(71) Applicant: BASF Coatings GmbH, Münster (DE)

(72) Inventors: Pieter Jan De Roij, Eindhoven (NL); Ernst Dullemeijer, Eindhoven (NL); Eduard Renier Francisca Clerkx, Eindhoven (NL)

(73) Assignee: BASF Coatings GmbH, Münster (DE)

( * ) Notice: Subject to any disclaimer, the term of this patent is extended or adjusted under 35 U.S.C. 154(b) by 512 days.

(21) Appl. No.: 15/746,683

(22) PCT Filed: Jul. 25, 2016

(86) PCT No.: PCT/NL2016/050552
§ 371 (c)(1),
(2) Date: Jan. 22, 2018

(87) PCT Pub. No.: WO2017/014639
PCT Pub. Date: Jan. 26, 2017

(65) Prior Publication Data
US 2018/0223430 A1 Aug. 9, 2018

(30) Foreign Application Priority Data
Jul. 23, 2015 (NL) ..................................... 2015215

(51) Int. Cl.
*C23C 16/455* (2006.01)
*C23C 16/458* (2006.01)
*C23C 16/54* (2006.01)

(52) U.S. Cl.
CPC .... *C23C 16/45551* (2013.01); *C23C 16/4584* (2013.01); *C23C 16/4586* (2013.01);
(Continued)

(58) Field of Classification Search
CPC ............ C23C 16/545; C23C 16/45525; C23C 16/45544; C23C 16/45546;
(Continued)

(56) References Cited

U.S. PATENT DOCUMENTS

2010/0178481 A1* 7/2010 George ................... C23C 28/00
428/213
2012/0321910 A1* 12/2012 Sneh .................. C23C 16/45551
428/698

(Continued)

FOREIGN PATENT DOCUMENTS

| DE | 10 2012 207 172 A1 | 10/2013 |
|---|---|---|
| TW | 201511085 A | 3/2015 |
| WO | WO 2013/022339 A1 | 2/2013 |

OTHER PUBLICATIONS

International Search Report, issued in PCT/NL2016/050552, dated Nov. 23, 2016.
(Continued)

*Primary Examiner* — Elizabeth A Burkhart
(74) *Attorney, Agent, or Firm* — Armstrong Teasdale LLP

(57) ABSTRACT

A deposition apparatus including a frame and a cylindrical drum with a cylindrical surface that extends along a central axis. The drum has a first and a second end surface, which extend perpendicularly to the central axis. The drum is rotatably mounted in the frame and includes a plurality of gas zones positioned on the cylindrical surface. The included gas channels extend within the drum. At least a number of the gas zones are in gas connection with at least two channels. The deposition apparatus includes closing elements for closing off all but one of the at least two channels with which a said gas zone is in gas connection so that the type of gas supplied to the various gas zones along the drum surface is programmable.

28 Claims, 14 Drawing Sheets

(52) U.S. Cl.
CPC .. *C23C 16/45553* (2013.01); *C23C 16/45561* (2013.01); *C23C 16/45578* (2013.01); *C23C 16/545* (2013.01)

(58) Field of Classification Search
CPC ........ C23C 16/45548; C23C 16/45551; C23C 16/45553; C23C 16/45578; C23C 16/45561; C23C 16/4584
USPC ....................................................... 118/718
See application file for complete search history.

(56) References Cited

U.S. PATENT DOCUMENTS

| | | |
|---|---|---|
| 2013/0064977 A1 | 3/2013 | Vermeer et al. |
| 2013/0089665 A1* | 4/2013 | Takenaka .............. C23C 16/545 427/248.1 |
| 2014/0366803 A1 | 12/2014 | Yamada et al. |
| 2015/0086715 A1* | 3/2015 | Knaapen ........... C23C 16/45589 427/255.7 |
| 2015/0132872 A1 | 5/2015 | Bauer et al. |

OTHER PUBLICATIONS

Written Opinion of the International Searching Authority, issued in PCT/NL2016/050552, dated Nov. 23, 2016.

* cited by examiner

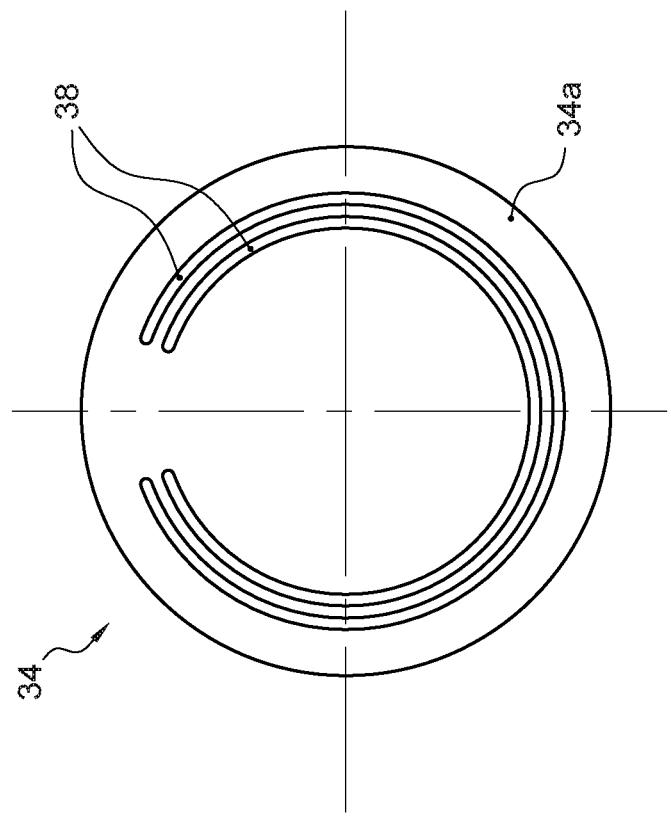
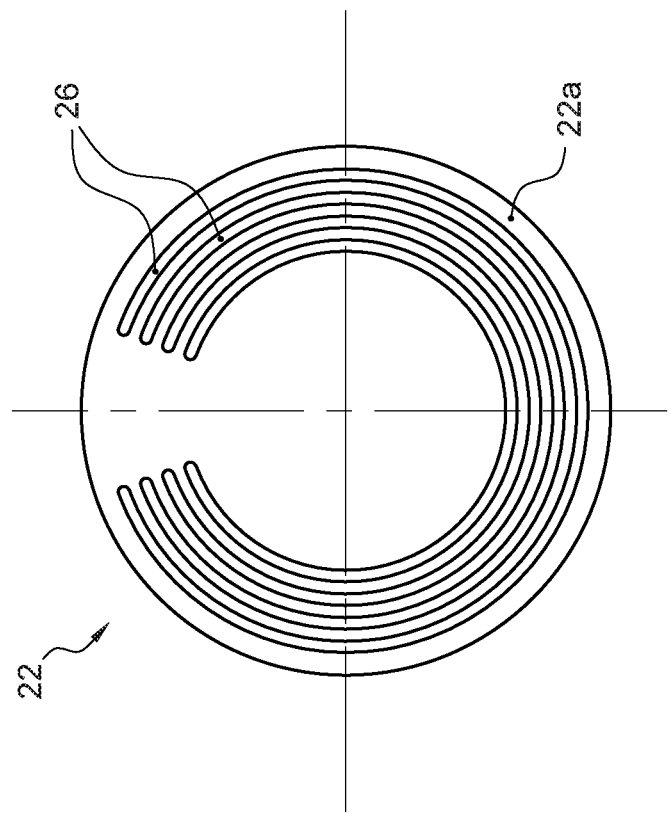

PROGRAMMABLE DEPOSITION APPARATUS

FIELD

The invention relates to a deposition and more specifically to a programmable deposition apparatus.

BACKGROUND

Atomic layer deposition is well-known in the art, for example for depositing atomic layers on a flexible substrate. WO2013/022339 for example discloses an atomic layer deposition apparatus that is configured for depositing a stack of atomic layers on a surface of a flexible substrate.

The known apparatus comprises a frame that rotatably supports a cylindrical drum that has a cylindrical surface and two end surfaces. The cylindrical surface of the drum is provided with openings that form gas zones. Each gas zone is connected to a gas channel that extends within the drum to an opening in one of the end surfaces. The apparatus further comprises two sealing plates, wherein each end surface is provided with a sealing plate. Each sealing plate has a connection side provided with gas openings to connect gas supply sources to the sealing plate. During operation, a gas flow path exists between a specific gas source and each gas zone. A flexible substrate is bent around the rotating deposition head so that the substrate surface faces the gas zones. During operation, the substrate is guided along the rotating drum surface and atomic layers are deposited on the substrate.

A disadvantage of the known apparatus is that the configuration of the layers that is deposited on the substrate surface can not be changed. As a result, each process requires an apparatus configured for that specific process. This is costly and inefficient.

SUMMARY OF THE INVENTION

An object of the invention is to provide a deposition apparatus that alleviates the disadvantage of the prior art device. To that end, the invention provides a deposition apparatus including:
a frame;
a cylindrical drum having a cylindrical surface extending around a central axis and a first and a second end surface which extend perpendicularly to the central axis, the drum being rotatably mounted in the frame, the cylindrical drum including:
  channels extending within the cylindrical drum of which an inlet is connectable to a gas source or an exhaust;
  a plurality of gas zones positioned on the cylindrical surface, wherein at least a number of the plurality of gas zones is in gas connection with at least two channels;
  closing elements for closing off all but one of the at least two channels with which a said gas zone of the number of the plurality of gas zones is in gas connection.

An advantage of the deposition apparatus according to the invention is that the apparatus is programmable to provide a specific configuration with regard to the sequence of the deposited layers and the resulting composition of the stack of layers on the substrate. This is done by virtue of a number of gas zones that are configured to selectively supply different gases or to exhaust a gas from the zone. The said number of gas zones is connected to multiple channels, each of which may be connected to a different gas source or to an exhaust. The closing elements are used to selectively close off all but one of the channels for each gas zone, in order to supply a single gas via each gas zone to the substrate or to exhaust a gas from a selected gas zone. By changing the configuration of closed off channels, the type of gas supplied by the gas zone can be changed or the gas zone can obtain the function of exhaust zone. By programming each of the gas zones of the number of gas zones, the sequence of deposition and therewith the composition of the stack of deposited layers, can be programmed. The apparatus may for example be connected to molecular layer precursor gas sources and atomic layer precursor gas sources in order to provide both molecular and atomic layers to the substrate. However, the configuration may also be chosen to provide multiple gas exhaust zones next to each other to provide an improved separation between gases that are provided to the gas zones. In an example, the selective programming of the zones may provide a configuration that deposits atomic layers of inorganic material interposed with molecular layers of organic material, but it may also comprise a stack of atomic layers of different compositions.

Another advantage of the apparatus is that, in addition to programming the sequence of deposition, the ratio of different layers, for example the ratio between the ALD-layers and the MLD-layers, can be programmed as well.

Yet another advantage of the apparatus according to the invention is that the sequence and composition of the layer may be adapted during the process. The apparatus may for example comprise an inspection unit to inspect the substrate directly after completion of the deposition. Any corrections needed to improve the quality of the substrate can directly be made by adapting the configuration of the gas supply to at least a part of the number of gas zones.

The invention also provides a method for applying layers on a substrate, the method including:
  providing an apparatus according to the invention or an embodiment of the invention;
  selectively closing off all but one of the channels for each gas zone, so that each gas zone is supplied with a single selected gas or, alternatively, exhausted;
  guiding a substrate around a part of the circumference of the cylindrical drum and create a relative movement between the substrate and the drum;
  supplying the respective gases to the associated selected gas zones; and
  exhausting gas from the associated selected gas zones of the plurality of gas zones.

With this method the sequence of the deposited layers and the resulting composition of the stack of layers on the substrate can be varied.

WO2013/022339 does not teach to selectively close off all but one of the channels for each gas zone gas so that the sequence of layers which are applied can be varied. In fact, WO2013/022339 only discloses to shut off all gas channels that are connected to a gas zone in the section of the drum where no substrate is guided over the drum. This is to prevent gas from flowing uncontrolled in the environment and to reduce the amount of gas that is used. Of course, also in the method and the apparatus as discussed in the detailed description below, the gas zones will preferably not be supplied with gas in the section where the drum is not covered with a substrate but that has no relation to the programmability of the sequence of gas supply and gas exhaust via the various gas zones of the drum.

Various embodiments are claimed in the dependent claims, which will be further elucidated with reference to some examples shown in the figures. The embodiments may be combined or may be applied separate from each other.

BRIEF DESCRIPTION OF FIGURES

FIG. 4A shows cross-sectional view over line IVA-IVA in FIG. 4;

FIG. 4B shows a cross-sectional view over line IVB-IVB in FIG. 4;

DETAILED DESCRIPTION

Figure 1:
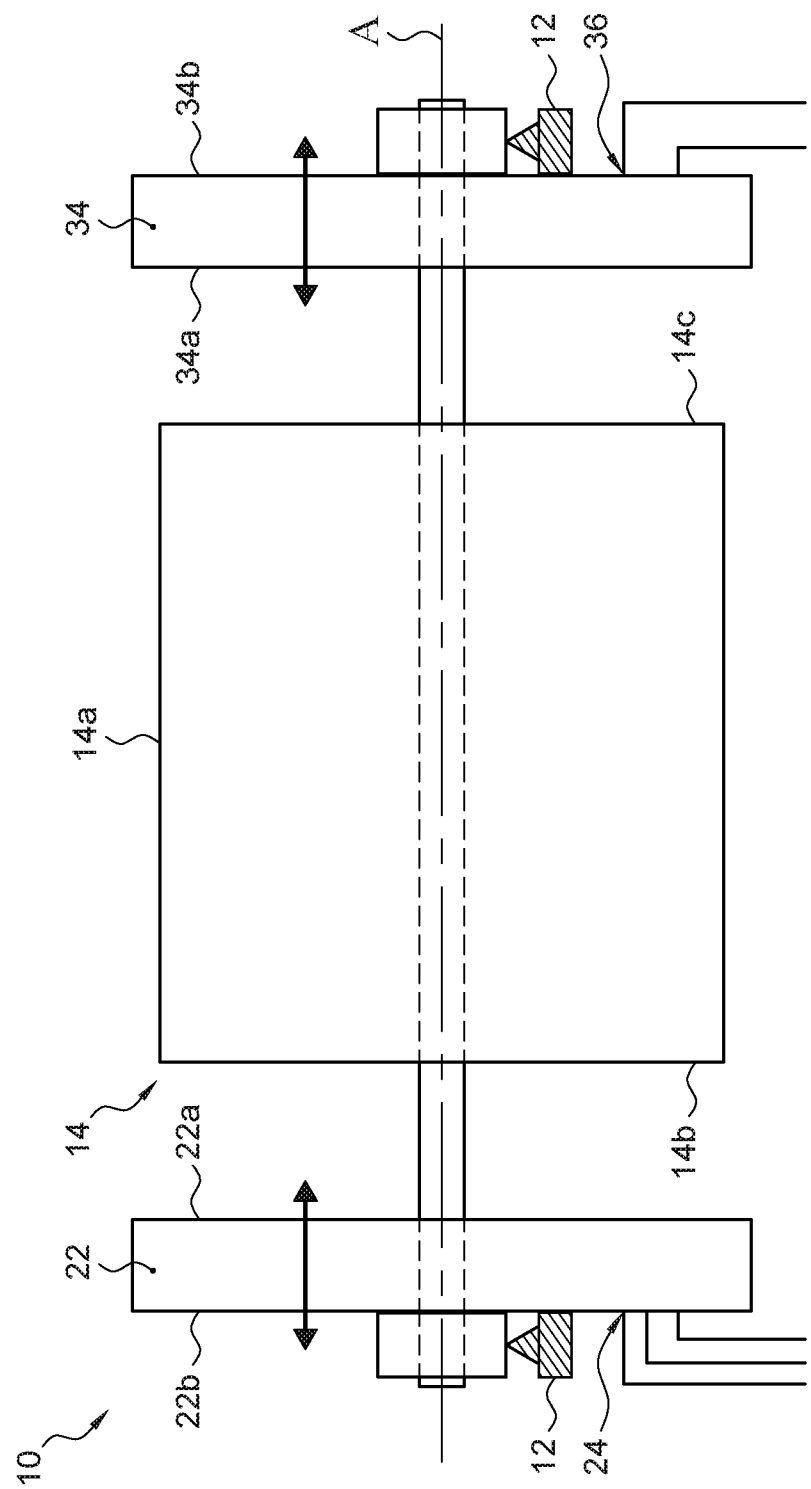
FIG. 1 shows a schematic side view of an example of a deposition apparatus.

In this application similar or corresponding features are denoted by similar of corresponding reference signs. The description of the various embodiments is not limited to the examples shown in the figures and the reference numbers used in the detailed description and the claims are not intended to limit the description of the embodiments. The reference numbers are included to elucidate the embodiments by referring to the examples shown in the figures.

FIGS. 1-11 show various examples of a deposition apparatus 10 in which various embodiments including the main aspect of the invention are present. In general terms, the deposition apparatus 10 includes a frame 12 and a cylindrical drum 14. The cylindrical drum 14 has a cylindrical surface 14a that extends around a central axis A. The cylindrical drum 14 also has a first end surface 14b and a second end surface 14c, which extend perpendicularly to the central axis A. The drum 14 is rotatably mounted in the frame 12. The cylindrical drum 14 furthermore includes channels 18 and optionally 32 that extend within the cylindrical drum 14. An inlet of the channels 18, 32 is connectable to a gas source or an exhaust. The cylindrical drum 14 also includes a plurality of gas zones 16 positioned on the cylindrical surface 14a. At least a number of the plurality of gas zones 16 is in gas connection with at least two channels 18. The cylindrical drum 14 furthermore also includes closing elements 30 for closing off all but one of the at least two channels 18 with which a said gas zone 16 of the number of the plurality of gas zones 16 is in gas connection.

The advantages of the apparatus according to the invention are described in the summary to which reference is made.

A gas zone 16 may be embodied as a plurality of small openings in the cylindrical surface 14a of the drum 14. Alternatively, a gas zone 16 may be embodied as a single line shaped chamber or as a plurality of parallel line shaped chambers in the cylindrical surface 14a of the drum 14. A gas zone 16 may be used to supply a gas to or to exhaust gas from the cylindrical surface 14a of the drum 14. Depending on the position of the closing elements 30, the function of a gas zone 16 may be switched from gas supply zone to gas exhaust zone.

The deposition apparatus 10 according to the invention may comprise various precursor and/or purge gas sources. Depending on the specific sources that are chosen, the deposition apparatus 10 may be configured to provide atomic layers, molecular layers or combinations thereof. In addition, the number of gas zones 16 that is connected to at least two channels of the plurality of channels may comprise all gas zones 16 provided in the drum 14. This would provide maximum flexibility, but would also require a higher degree of programming effort. A specific number of gas zones 16 that is connected to at least two gas channels may therefore be different for different applications of the deposition apparatus 10. Preferably, at least part of the gas zones 16 is only connected to an exhaust and at least part of the gas zones 16 is only connected to a purge gas source. This would provide sufficient separation and removal of precursor gases used in the deposition process in order substantially prevent mixing of precursor gases and subsequent unwanted depositions on the substrate FS and the cylindrical drum surface 14a of the deposition apparatus 10.

In an embodiment the channels 18 may include at least a first plurality of channels 18 extending within the drum 14 from the first end surface 14b to associated ones of the plurality of gas zones 16. Each channel 18 may form an opening 20 in the first end surface 14b. The deposition apparatus may further include a first sealing plate 22 having a sealing side 22a and a connection side 22b which is opposite the sealing side 22a. The first sealing plate 22 may include gas connection openings 24 in the connection side 22b to which gas supply lines and/or gas exhausts lines are connectable. Furthermore, the sealing plate 22 may include at least a number of ring channels 26 which extend in the sealing side 22a along a circular segment. A midpoint of the circular segments coincides with the central axis A of the drum 14. Each ring channel 26 may fluidly be connected to an associated gas connection opening 24 and each ring channel 26 may be in gas connection with at least one opening 20 in the first end surface 14b. At least a number of the plurality of gas zones 16 is in gas connection with at least two channels of the first plurality of channels 18. The deposition apparatus 10 includes closing elements 30 for closing off all but one of the at least two channels 18 with which a said gas zone 16 of the number of the plurality of gas zones 16 is in gas connection.

In an embodiment, of which an example is shown in FIG. 1, the sealing plate 22 may be moveable from a seal position in which the sealing side 22a is positioned against the first end surface 14b and a remote position in which the sealing plate 22 is moved away from the first end surface 14b.

The application of a moveable sealing plate 22 allows easy access to the openings of the gas channels 20 in the first end surface 14b and the ring channels 26 in the first sealing plate 22. If (manually insertable) plugs are used to close off channels connected to the gas zones 16, access to the gas openings 20 in the first end surface 14b is necessary to program the deposition apparatus 10. In addition, the application of a moveable sealing plate 22 is advantageous during servicing of the apparatus 10, as the channel openings 20 and gas channels 18 in the drum 14 and the ring channels 26 in the first sealing plate 22 are easily accessible.

In an embodiment, of which an example is provided in FIGS. 4, 9a, 10 and 11, the channels 18, 32 may include a second plurality of channels 32 that extend within the drum 14 from the second end surface 14c to associated ones of the plurality of gas zones 16 with each channel 32 forming an opening 33 in the second end surface 14c. The apparatus 10 may comprise a second sealing plate 34 with a sealing side 34a and a connection side 34b which is opposite the sealing side 34a. The second sealing plate 34 may include gas connection openings 36 in the connection side 34b to which gas supply lines and/or gas exhaust lines are connectable. The second sealing plate 34 may also include at least a number of ring channels 38. The ring channels 38 extend in the sealing side 34a along a circular segment of which a midpoint coincides with the central axis A of the drum 14. Each ring channel 38 is fluidly connected to an associated gas connection opening 36 and each ring channel 38 is in gas connection with at least one opening 33 in the second end surface 14c. At least a number of the plurality of gas zones 16 may be in gas connection with at least two channels of the first and/or the second plurality of channels 18, 32. The deposition apparatus 10 includes closing elements 30 for closing off all but one of the at least two channels with which a said gas zone 16 of the number of the plurality of gas zones 16 is in gas connection.

In this embodiment, mutually reactive gases, such as the different (reactive) precursor gases used in atomic layer deposition, may be connected to opposite sealing plates 22, 34. In case of leakage between the ring channels 26, 38 within the respective sealing plates 22, 34, the precursor gases are unable to mix and subsequently form unwanted depositions. Furthermore, having a second sealing plate 34 also provides additional space to connect gas sources to the drum 14. Therefore, the number of sources connected to the drum 14 may be increased, provided that the number of channels within the drum is increased as well. Alternatively, a gas channel may be connected to both sealing plates 22, 34, thus being able to be fed by two sources of a single composition, such as a purge gas. This is for example shown in FIGS. 10 and 11, in which a single channel (N2 (bearing)) is connected to purge gas sources on both sealing plates 22, 34. Alternatively, a gas channel that is connected to both sealing plates 22, 34, may, at each end, be connectable to a different gas source. During operation, at least one of both ends of such a channel is closed off by a closing element 30.

In an embodiment, of which an example is shown in FIG. 1, the second sealing plate 34 may also be moveable from a seal position in which the sealing side 34a is positioned against the second end surface 14c and a remote position in which the second sealing plate 34 is moved away from the second end surface 14c.

As with the moveable first sealing plate 22, the application of a moveable second sealing plate 34 allows easy access to the openings of the gas channels 33 in the end surface 14c and the ring channels 38 in the second sealing plate 34. If (manually insertable) plugs are used to close off channels connected to the gas zones 16, access to the gas openings 33 in the second end surface 14c is necessary to program the deposition apparatus 10. In addition, the application of moveable sealing plates 22, 34 is advantageous during servicing of the apparatus 10, as the channel openings 20, 33 and gas channels 18, 32 in the drum 14 and the ring channels 26, 38 in the sealing plates 22, 34 are easily accessible.

Figure 10:
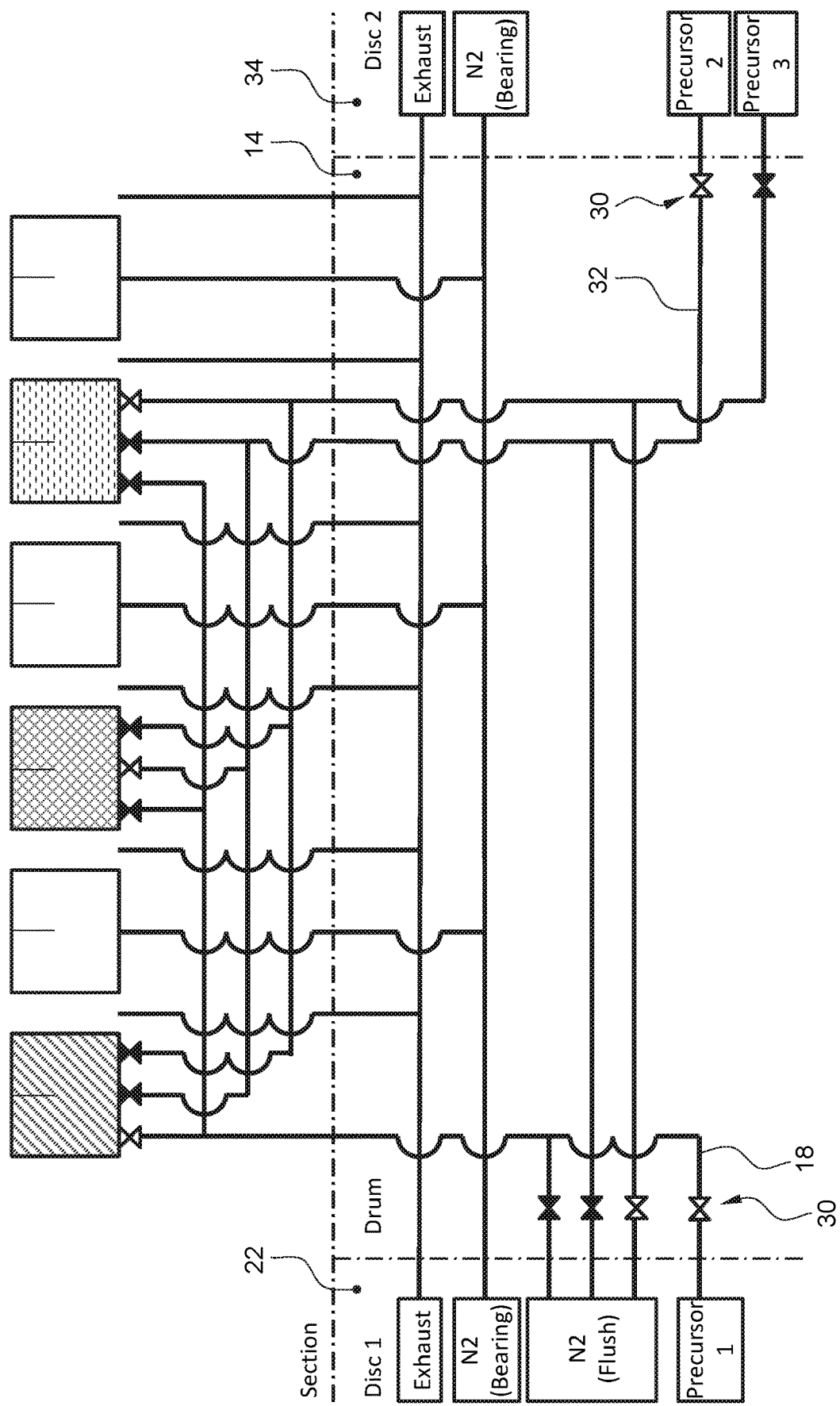
FIG. 10 shows a schematic gas supply configuration of an example of an ALD-process section.
Figure 11:
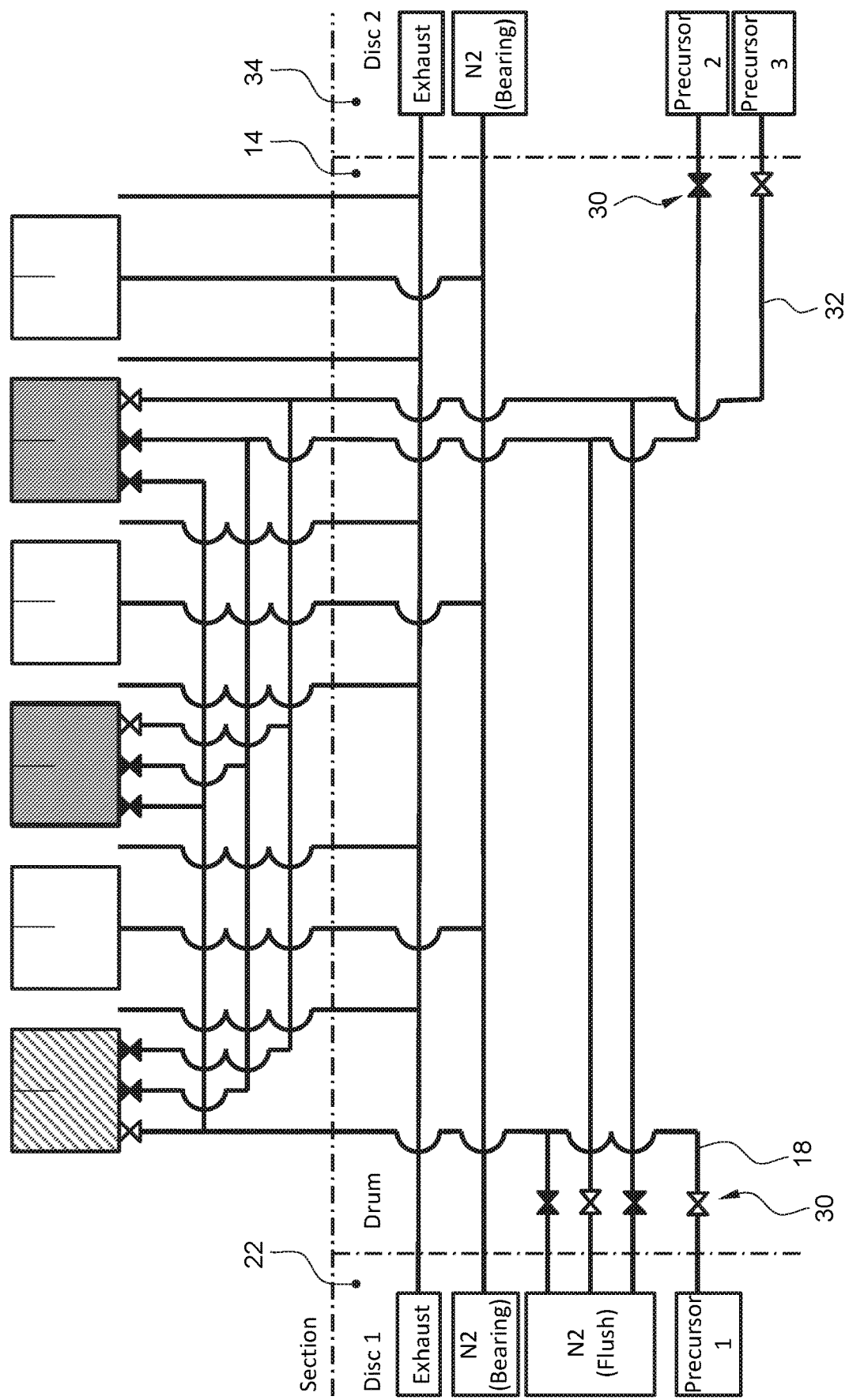
FIG. 11 shows a schematic gas supply configuration of an example an MLD-process section.

In an embodiment, an example of which is shown in FIGS. 10 and 11, the apparatus 10 may comprise a first subset of the plurality of gas zones that is connected to a first precursor gas source to form a first precursor gas zone. Additionally, a second subset of the plurality of gas zones may be connected to a second precursor gas source to form a second precursor gas zone. The apparatus 10 may also comprise a third subset of the plurality of gas zones that is connected to a purge gas source to form a purge gas zone. A fourth subset of the plurality of gas zones may be connected to an exhaust to form a gas exhaust zone. Furthermore, the apparatus 10 may comprise a fifth subset of the plurality of gas zones that is connected to a third precursor gas source to form a third precursor gas zone. The first and the second precursor gases may be associated with atomic layer deposition (ALD) and the first and the third precursor gases may be associated with molecular layer deposition (MLD).

The gas channels 18, 32 in the drum 14 are positioned such that subsets of gas zones are formed. The openings 20, 33 of the channels 18, 32 associated with each subset terminate in a ring channel 26, 38 of the first and/or second sealing plate 22, 38 respectively. As such, each zone subset is associated with a specific gas source or an exhaust. In this embodiment, the gas sources are chosen such that the apparatus 10 is configured to provide both atomic layers and molecular layers to the substrate. Such a configuration is for example used in the manufacturing of (flexible) substrates for OLED's, photo-voltaics, flexible electronics and/or passivation layers for solar cells. The specific gas sources used to provide the atomic and molecular layers may comprise any gases suitable for atomic and/or molecular layer deposition, such as for example TMA, $H_2O$, ethanol etc.

An advantage of this embodiment is that it solves an additional problem associated with the known apparatus. The known apparatus may stack only a limited number of atomic layers on the substrate surface without incurring fissures in the stack of layers. This is due to the fact that atomic layers, often comprised of inorganic material such as for example $AL_2O_3$, are relatively rigid. A stack of layers has an increased rigidity, as the rigidity of the individual layers adds up. As a result, the rigidity of a stack of layers increases with each layer that is added to the stack, causing the stack to be less flexible to bending and stretching. However, in order to provide continuous processing, the substrate is bent around the surface of the drum. The bending of the substrate, in combination with the increasing rigidity of the stack, causes fissures in the stack at a certain number of deposited atomic layers. Therefore, the number of layers that can be added to the substrate surface is limited. In this embodiment, atomic layers and molecular layers are alternated, with the molecular layers increasing the flexibility of the stack of layers, by releasing stress between individual ALD deposited layers, thus reducing the chance of fissures in the stack. The specific alternation sequence of the layers may be programmed using the apparatus of the invention to provide the most efficient stack.

In an embodiment, examples of which are shown in FIGS. 10 and 11, each of the at least two channels of a gas zone 16 of said number of gas zones 16 is in gas connection with a different one of the first precursor gas source, the second precursor gas source, the third precursor gas source, the purge gas source or the exhaust.

To provide programmability to the gas zones 16 of the number of gas zones 16, each gas zone 16 is connected to at least two different sources or to a gas source and the exhaust. By programming each of the gas zones 16, the deposition apparatus 10 may be programmed in terms of type, ratio and sequence of deposited layers. FIGS. 10 and 11 provide examples of gas zones 16 that are connected to multiple gas sources. FIG. 10 for example shows a first gas zone 16 (the gas zone depicted most left) that is connected to a first precursor gas source, a second precursor gas source and a purge gas source. The connection of a purge gas source to the gas zone 16 allows the gas zone 16 to be purged of any residual precursor gas before emitting a different (reactive) precursor gas through the gas zone 16. This substantially prevents clogging of the gas zone 16 between residues of reactive precursor gases. In both FIG. 10 and FIG. 11, the gas channels 18, 32 are provided with closing elements near the gas zone 16 as well as near the gas openings in the end surfaces 14b, 14c of the drum 14. This allows multiple sources to be connected to a single channel 18, 32. This may for example comprise a precursor gas source and a purge gas source to allow the gas channel 16 to deliver either one of a precursor or a purge gas.

In an embodiment, the apparatus may comprise a first subset of the plurality of gas zones that is connected to a first precursor gas source to form a first precursor gas zone. Additionally, a second subset of the plurality of gas zones may be connected to a second precursor gas source to form a second precursor gas zone. The apparatus 10 may further comprise a third subset of the plurality of gas zones that is connected to a purge gas source to form a purge gas zone. A fourth subset of the plurality of gas zones may be connected to an exhaust to form a gas exhaust zone. Furthermore, the apparatus 10 may comprise a fifth subset of the plurality of gas zones that is connected to a third precursor gas source to form a third precursor gas zone. A sixth subset of the plurality of gas zones may be connected to a fourth precursor gas source to form a fourth precursor gas zone. The first and the second precursor gases may be associated with atomic layer deposition for depositing a first atomic layer and the third and fourth precursor gases may be associated with atomic layer deposition for depositing a second atomic layer or with molecular layer deposition for depositing a molecular layer.

This embodiment provides an alternative configuration of the deposition apparatus 10. By connecting different ALD-precursor gas sources to the gas connection openings 24, 36 of the sealing plate 22, 34, atomic layers of different composition may be deposited on the substrate FS. It should be noted that the deposition apparatus 10 may also comprise a combination of both embodiments discussed above. Such a combination would provide a deposition apparatus 10 that is configured to provide atomic layers of different composition as well as molecular layers to the substrate FS. The skilled person may appreciate that alternative options, including multiple molecular layers may also be possible.

In a further elaboration of the embodiment in which the apparatus 10 is connected to four precursor gas sources, each of the at least two channels of a gas zone 16 of said number of gas zones 16 is in gas connection with a different one of the first precursor gas source, the second precursor gas source, the third precursor gas source, the purge gas source or the fourth precursor gas source.

Figure 2:
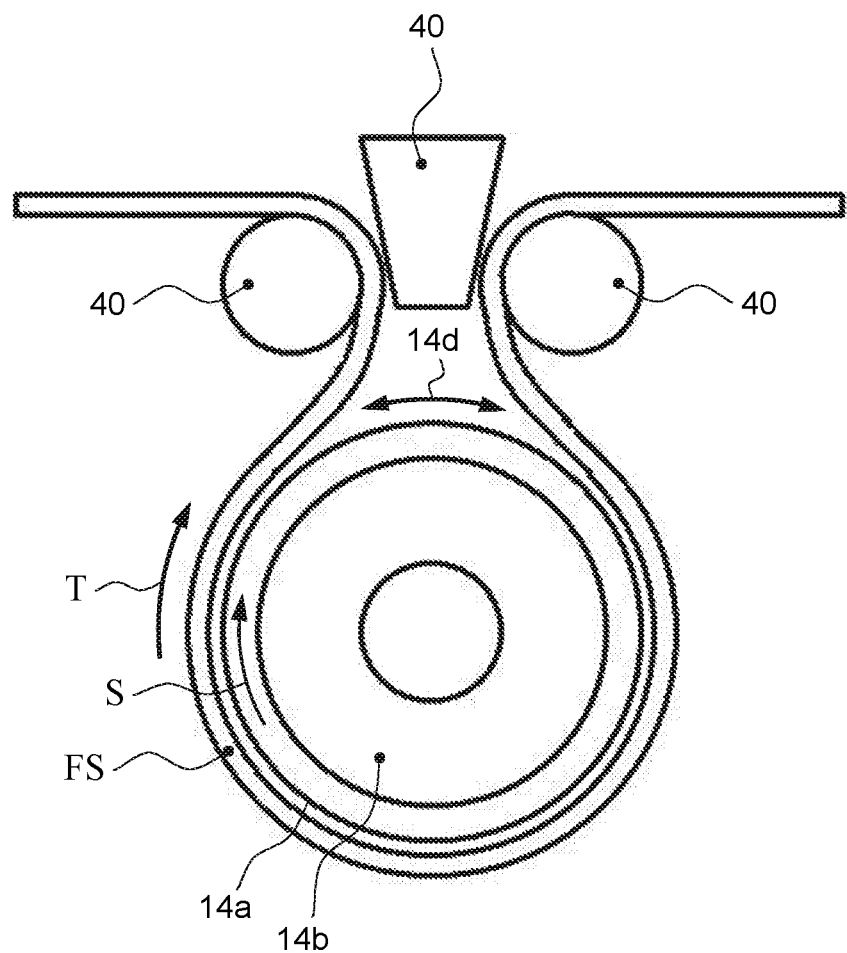
FIG. 2 shows a schematic front view of an example of a deposition apparatus.
Figure 3:
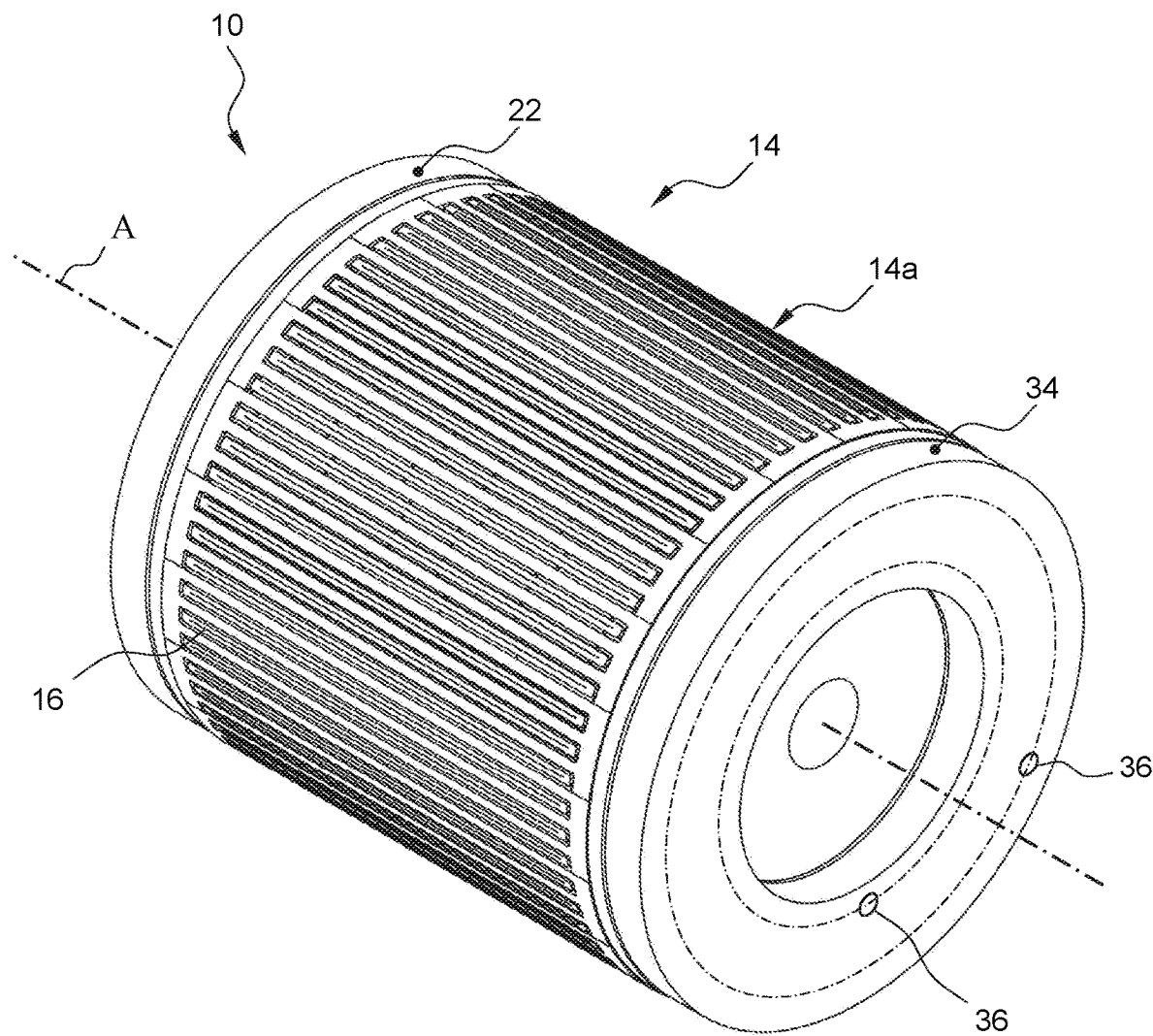
FIG. 3 shows a perspective view of an example of a drum according to the invention.
Figure 3A:
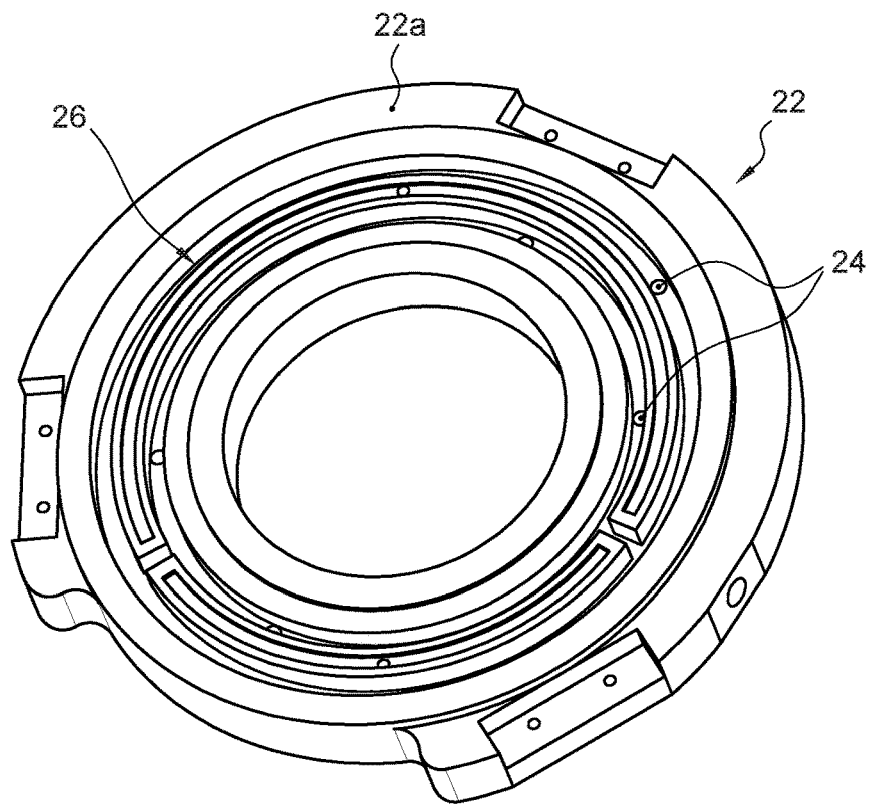
FIG. 3A shows a perspective view of the sealing side of the first sealing plate of the example of FIG. 3.
Figure 3B:
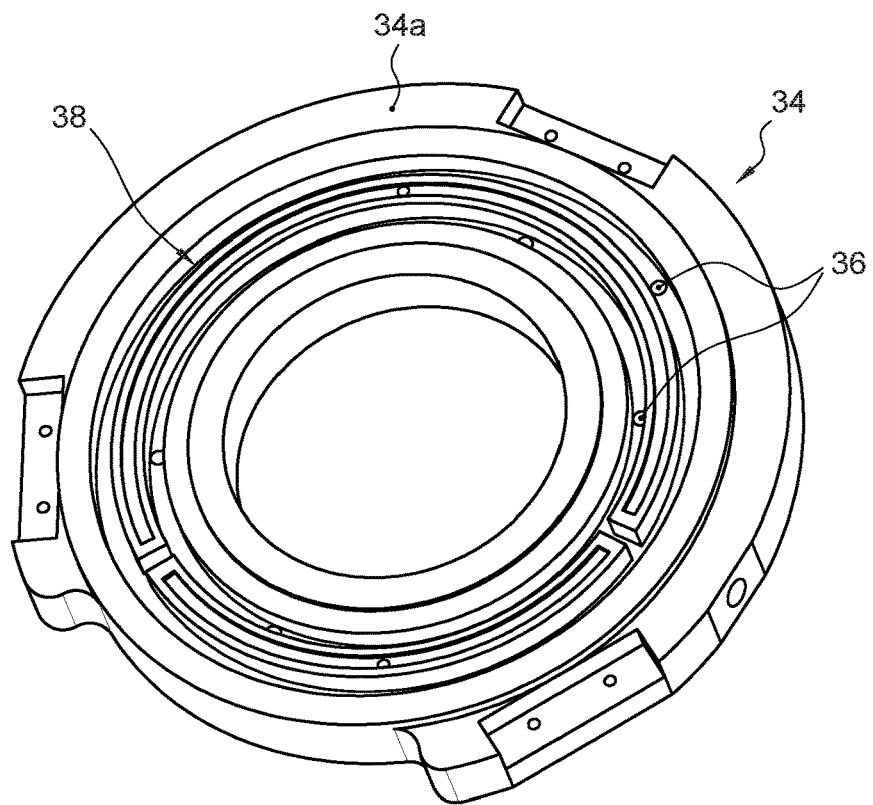
FIG. 3B shows a perspective view of the sealing side of the second sealing plate of the example of FIG. 3.
Figure 4:
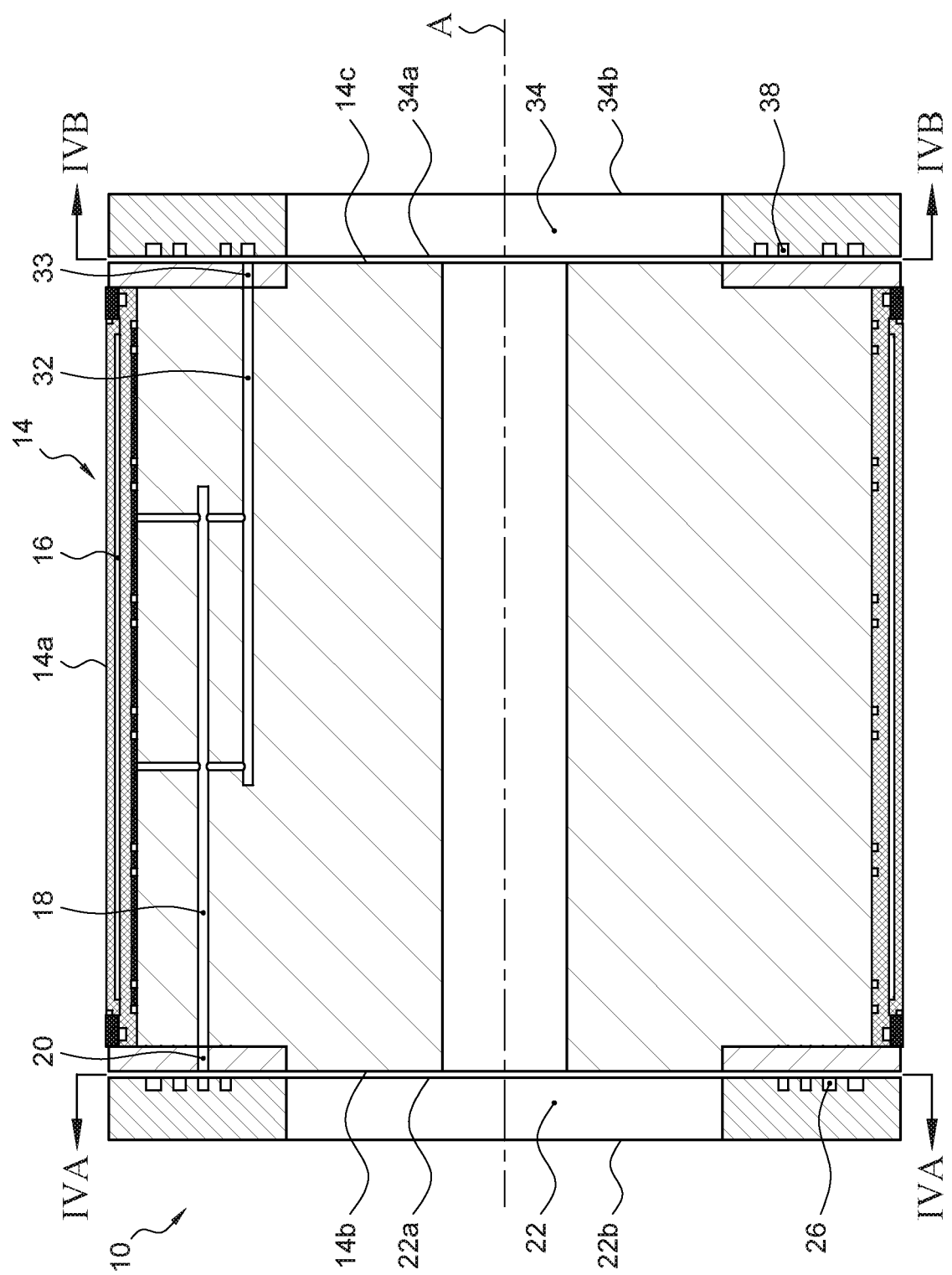
FIG. 4 shows a schematic cross-section of the drum of FIG. 3A along a vertical plane.
Figure 5B:
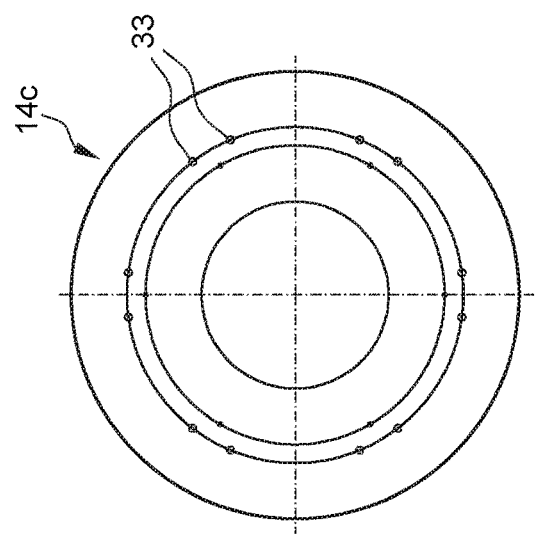
FIG. 5B shows a cross-sectional view over line VB-VB in FIG. 5.
Figure 5A:
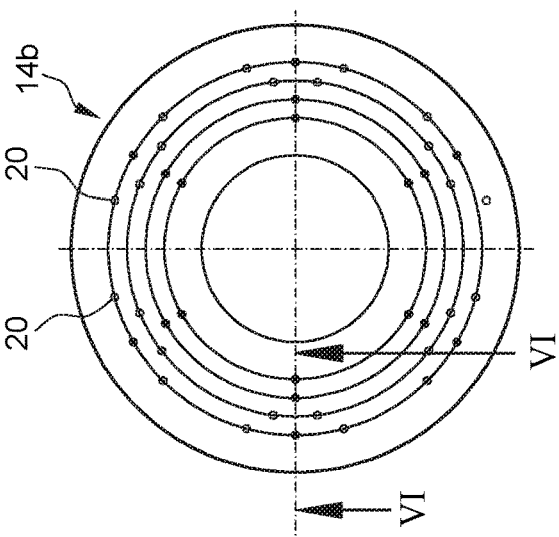
FIG. 5A shows cross-sectional view over line VA-VA in FIG. 5.
Figure 5:
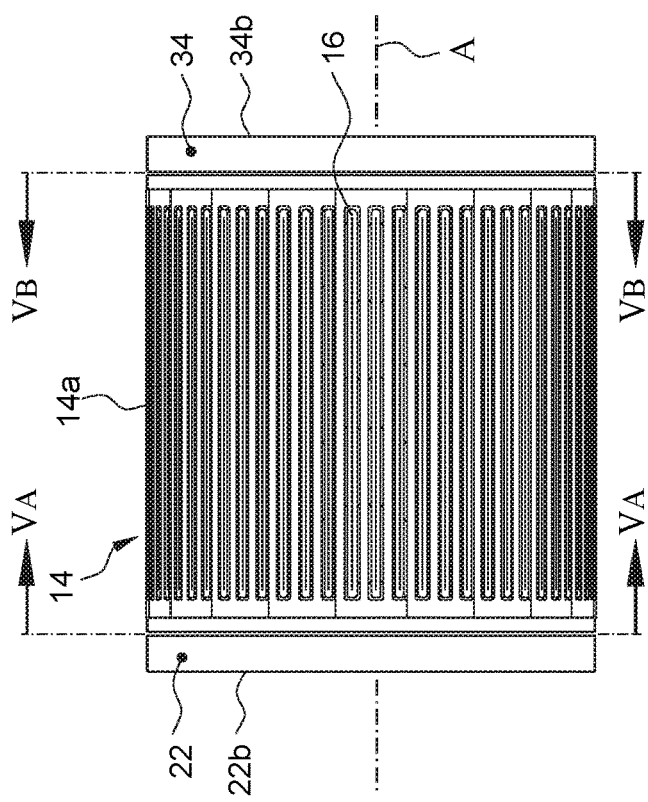
FIG. 5 shows a schematic side view of the drum of FIG. 3.

In an embodiment, an example of which is shown in FIG. 2, the apparatus may include a substrate guiding assembly 40 for guiding a flexible substrate FS around a substantial circumferential portion of the drum 14 with a substrate transport speed T. In use the rotational speed of the drum 14 provides a peripheral velocity S to the cylindrical surface 14a of the drum 14 which is different from the substrate transport speed T. As is clear from FIG. 2, a segment 14d of the cylindrical surface 14a of the drum 14 is not covered by the flexible substrate FS. As will be disclosed later, in an embodiment the supply of gas to that segment 14d may be interrupted.

To increase the efficiency of the deposition apparatus, the flexible substrate FS is guided around a substantial part of the cylindrical drum surface 14a, which increases the deposition area and allows a (semi-) continuous deposition process. To provide multiple layers on the substrate FS, the peripheral speed S of the cylindrical drum surface 14a is chosen different from the transport speed T of the substrate FS. More specifically, the amount of layers deposited on the substrate FS depends on the frequency of the drum rotation, the number of gas zones 16 present in the cylindrical drum surface 14a and the transport speed T of the substrate. By increasing or decreasing the peripheral velocity of the cylindrical drum surface 14a and/or the transport speed of the substrate, the number of deposited layers (and thus the thickness of the stack) can be programmed.

In an embodiment, an example of which is shown in FIG. 2, the peripheral velocity S of the cylindrical surface 14a may be at least 5 times higher than the transport speed T of the substrate FS. Preferably the peripheral velocity S of the cylindrical surface 14a is at least 100 times higher than the transport speed T of the substrate FS.

In an embodiment, the direction of movement of the substrate FS may, in use, be opposite to the direction of movement of the cylindrical surface 14a.

In an embodiment, of which examples are shown in FIGS. 10 and 11, in which at least part of the subsets of the plurality of gas zones are connected to sources of atomic layer deposition or molecular layer deposition, during use, an arrangement of gas zones 16 may be formed on the cylindrical surface 14a that, when viewed in the direction of rotation, comprises process sections for ALD and process sections for MLD. Each process section successively comprises a purge gas zone, a gas exhaust zone, a precursor gas zone, and a gas exhaust zone.

An example of an ALD process section according to the embodiment is shown in FIG. 10. The process section comprises a first precursor gas zone, a gas exhaust zone, a purge gas zone, a gas exhaust zone, a second precursor gas zone, and a gas exhaust zone.

An example of an MLD process section according to the embodiment is shown in FIG. 11. The MLD process section successively comprises a first precursor gas zone, a gas exhaust zone, a purge gas zone, a gas exhaust zone, a second precursor gas zone, a gas exhaust zone, a purge gas zone, a gas exhaust zone, a second precursor gas zone, a gas exhaust zone, a purge gas zone and a gas exhaust zone.

In an embodiment, the purge gas may, during use of the apparatus 10, be supplied so that the purge gas zones provide a gas bearing to floatingly support the substrate FS.

Providing gas bearings to floatingly support the substrate FS allows an efficient transport of the substrate along the cylindrical drum surface 14a and reduces the risk of fracturing of the substrate FS. In addition to providing gas bearings by virtue of the purge gas zones, the precursor gas zones may be used to provide gas bearings to the substrate. This may for example be done by adding nitrogen ($N_2$) to the precursor gas supply for providing the gas bearing.

Figure 6:
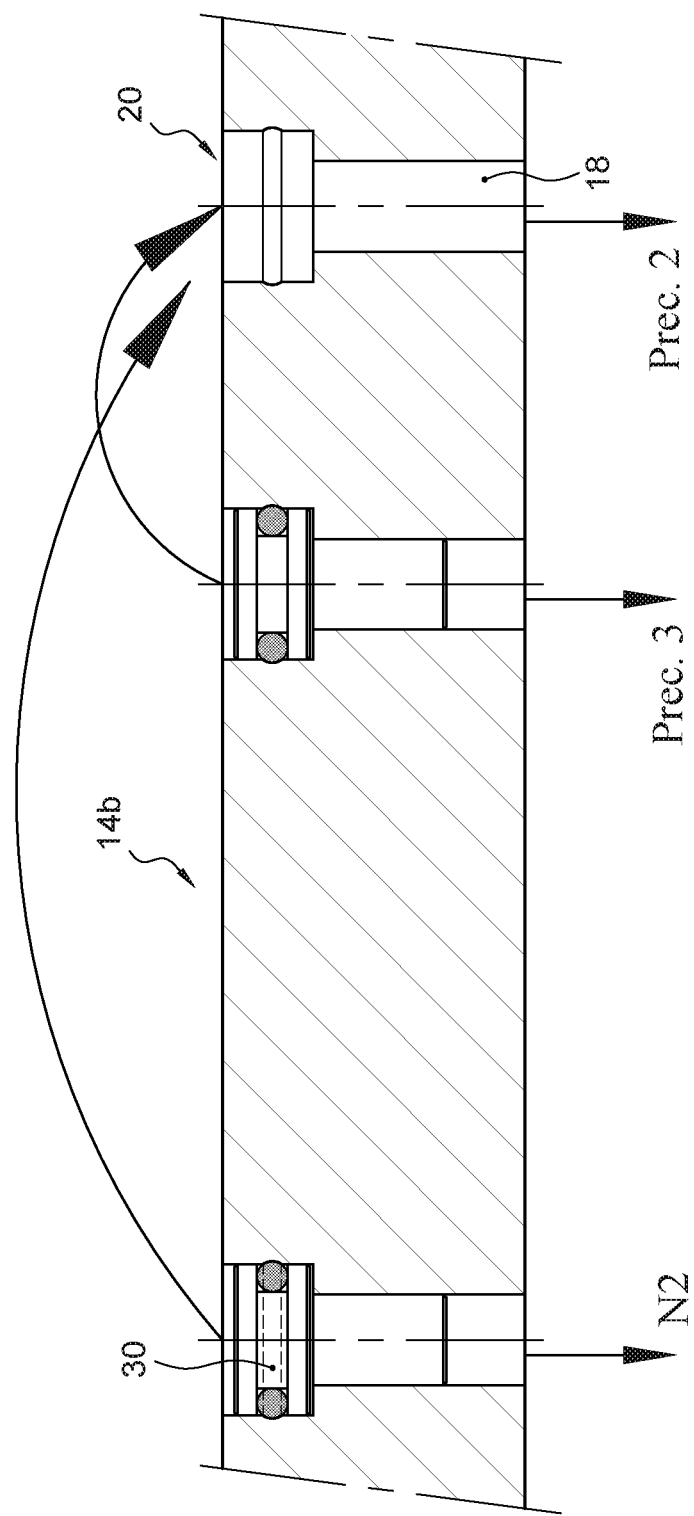
FIG. 6 shows a schematic cross-section along the line VI-VI of FIG. 5A.

In an embodiment, an example of which is shown in FIG. 6, at least one of the closing elements 30 may be a removable plug that is insertable in a channel 18, 32 for closing off said channel 18, 32.

Closing off all but one of the at least two channels may be done using plugs 30 that are inserted in the gas openings 20, 33 in the end surfaces 14b, 14c of the drum 14. After a specific programming of the deposition apparatus 10 is chosen, the plugs are inserted in the gas openings 20, 33 and the sealing plates 22, 34 are closed. As shown in FIG. 6, the plug 30 may be transferrable between the precursor channels and the purge gas channel ($N_2$)

In an embodiment, at least one of the closing elements 30 may be a valve. The closing element 30 may also be provided as a valve that can be positioned near the gas openings 20, 33 in the end surfaces 14b, 14c of the drum 14.

The valve, when it is remotely operable, may also be provided near the gas zone 16 to selectively close off a gas channel 18, 32. In addition, the configuration of the closing elements 30 may be such that each gas channel 18, 32 of the at least two gas channels is provided with two closing elements 30, one of which is positioned near the gas zone 16, whereas the other is positioned near the gas openings 20, 33 in the end surfaces 14b, 14c of the drum 14. This allows an increased flexibility as one gas channel 18, 32 may be connected to different sources.

In an embodiment the closing elements 30 may be embodied as replaceable manifold inserts.

Figure 7:
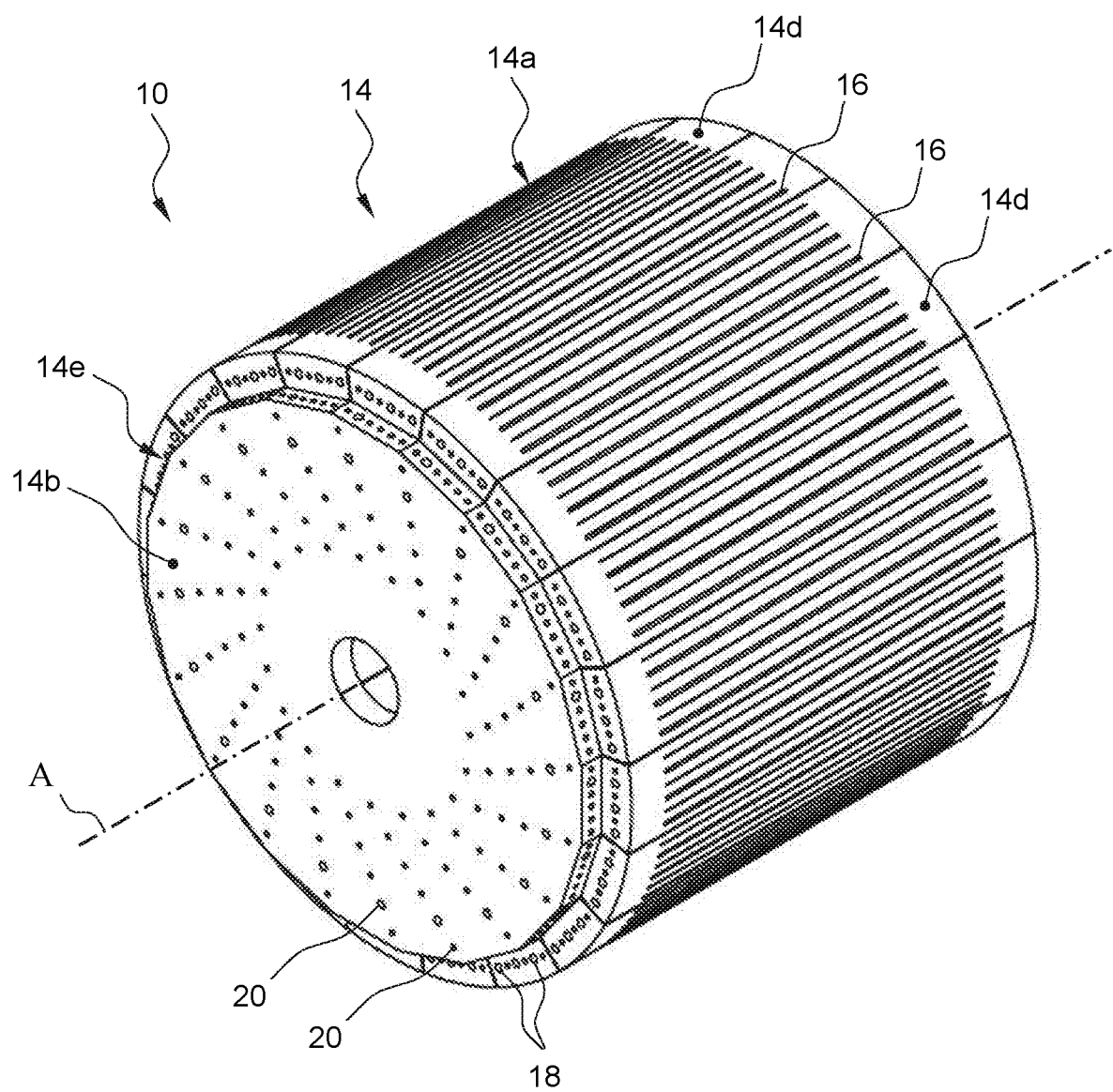
FIG. 7 shows a perspective view of a second example of a drum according to the invention when the closing elements are not attached.
Figure 8:
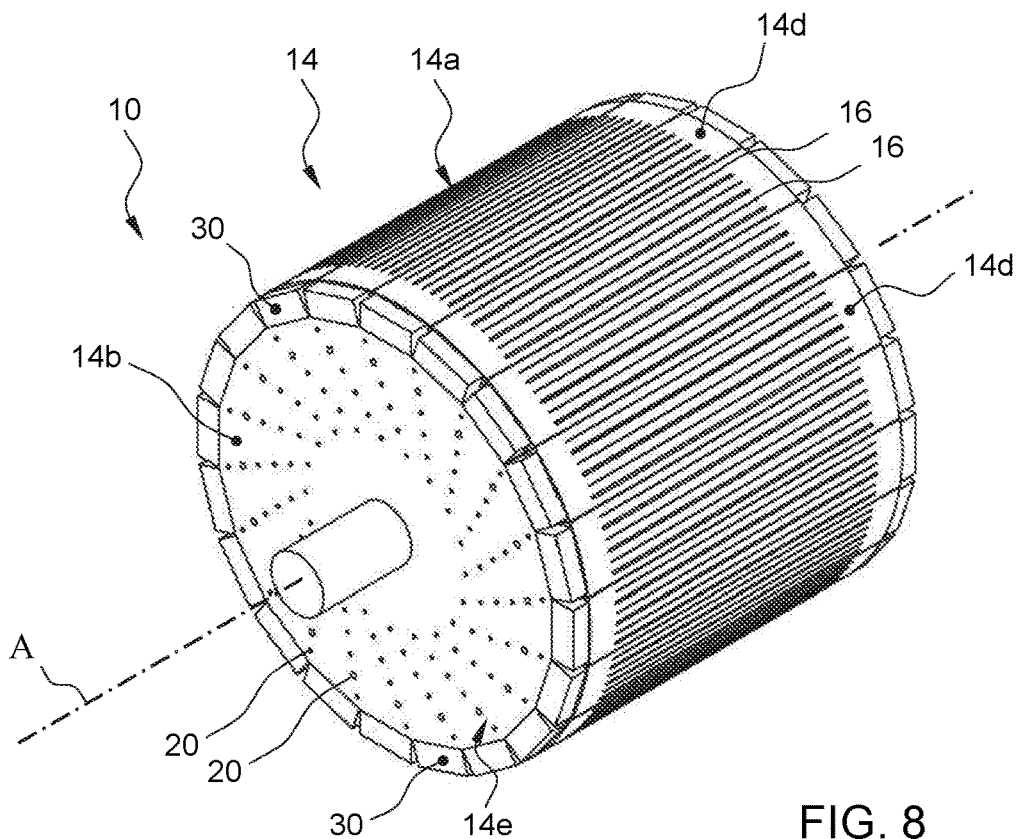
FIG. 8 shows the drum of FIG. 7 with the closing elements attached to the drum.
Figure 9:
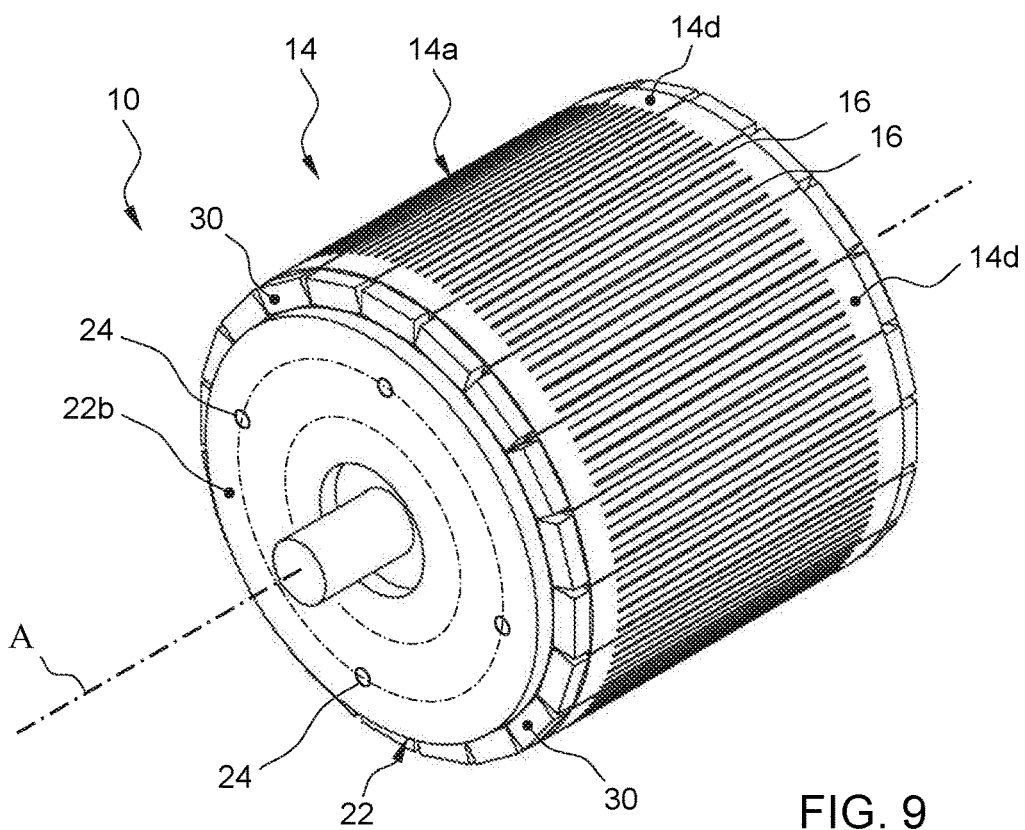
FIG. 9 shows the drum of FIG. 8 with the sealing plates attached to the drum.
Figure 8A:
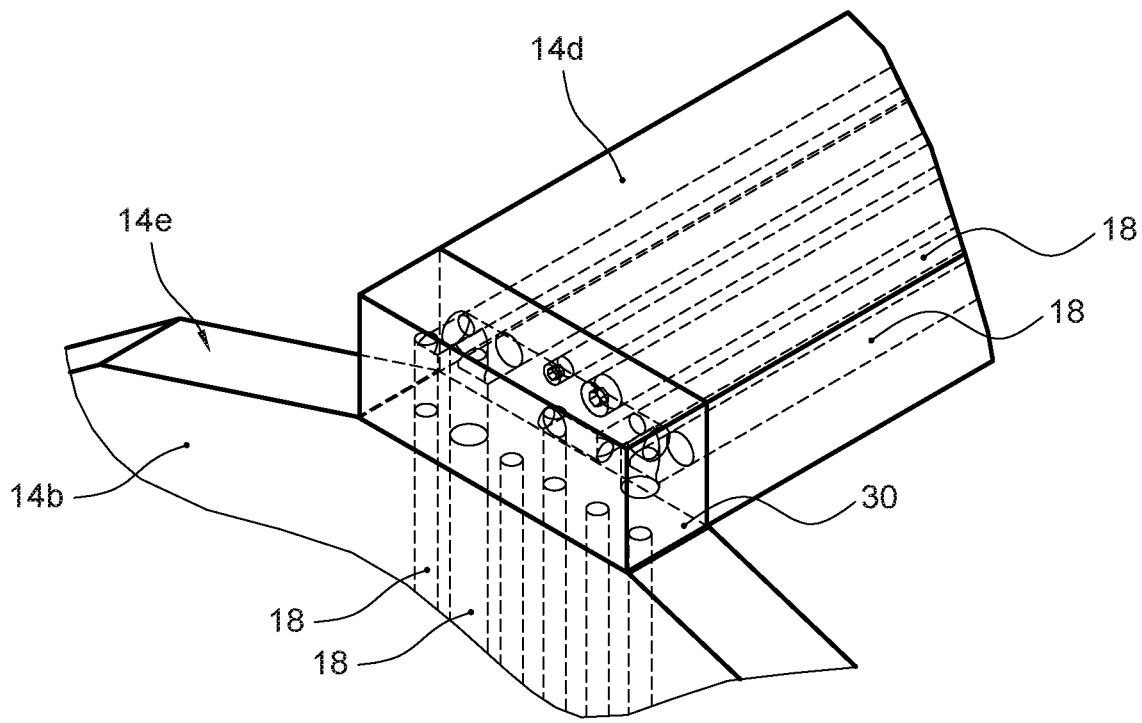
FIG. 8a shows a schematic detail of FIG. 8 in which the channels in the end surface plate of the drum, the channels extending in the drum segments and in the closing elements are depicted.
Figure 8B:
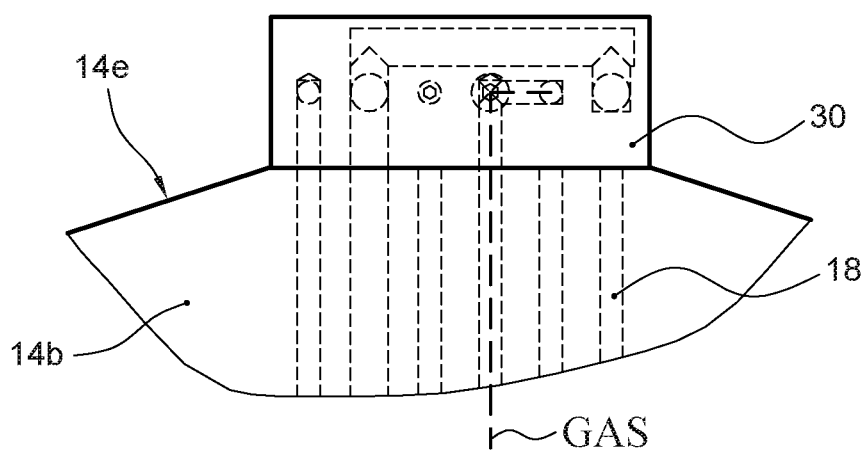
FIG. 8b shows an alternative view of the schematic detail of FIG. 8 in which the channels in the end surface plate of the drum, the channels extending in the drum segments and in the closing elements are depicted.
Figure 9A:
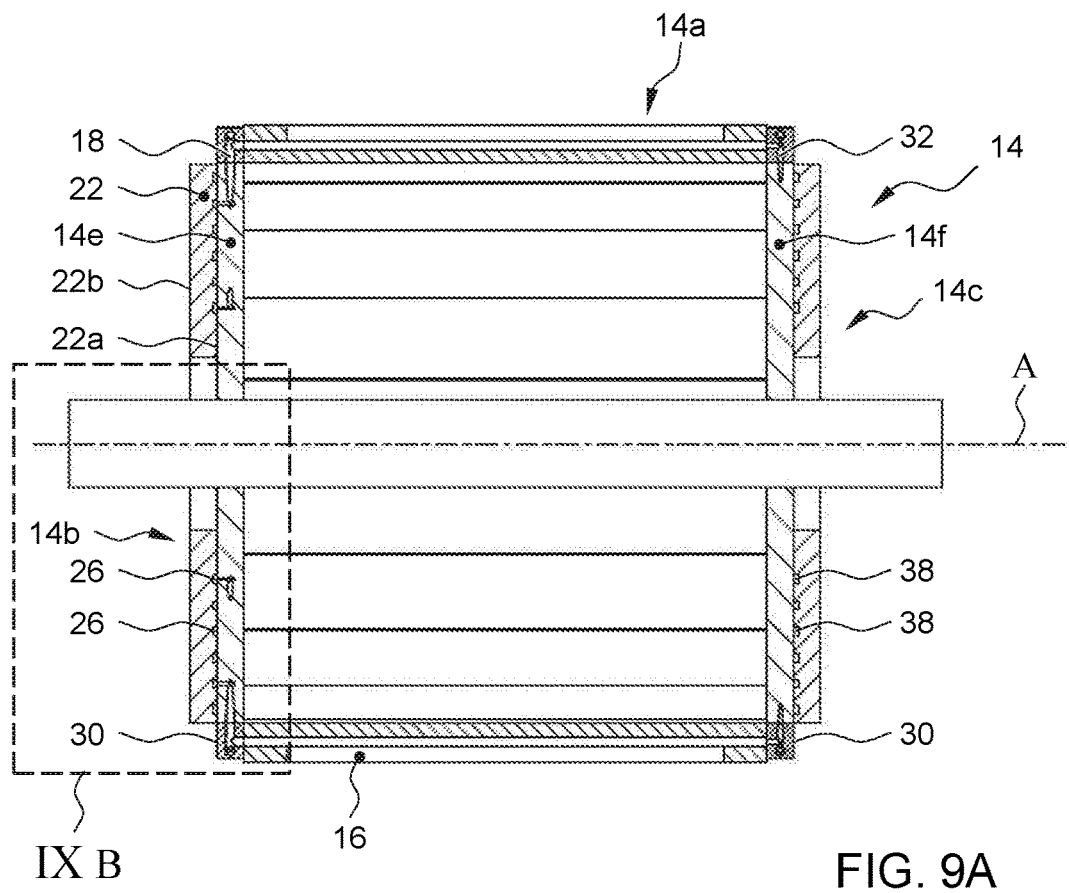
FIG. 9A shows a cross-sectional overview of the drum of FIG. 9 along a vertical plane.
Figure 9B:
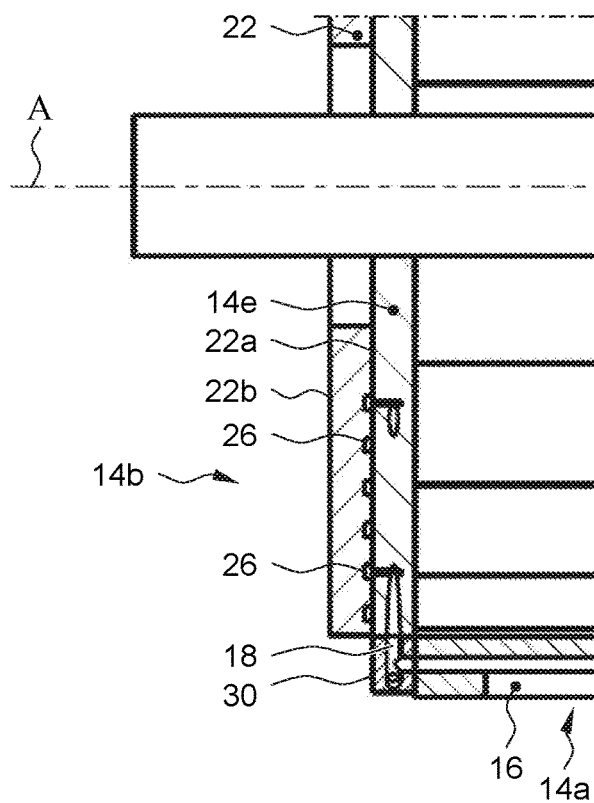
FIG. 9B shows an enlargement of the area IXB-IXB of FIG. 9A.

In an embodiment, of which an example is shown in FIGS. 7-9, the drum 14 may include drum segments 14d which define the cylindrical drum surface 14a. Each of the channels 18, 32 may include a first part that extends within the drum segments 14d. The drum 14 may additionally include a first and a second end surface plate 14e, 14f which define the first and the second end surface 14b, 14c respectively. Each of the channels 18, 32 may include a second part that extends within an associated end surface plate 14e, 14f in a substantial radial direction from a gas opening 20, 33 in the associated end surface 14b, 14c to a peripheral edge of said end surface plates 14e, 14f. The manifold inserts 30 are connectable to the peripheral edges of the end surface plates 14e, 14f and/or to the drum segments 14d. The manifold inserts 30 are provided with at least one passage. Each passage may include an end that is fluidly connectable to the first part of a channel 18, 32 and an opposite end that is fluidly connectable to the second part of a channel 18, 32. In an exceptional case it is even possible that an insert manifold 30 contains no passages.

The manifold inserts 30 have the advantage that they can be placed and removed in a short period of time, which increases the speed with which the configuration of the drum 14 can be changed. As a result, the downtime of the apparatus required to enact a change in the configuration is reduced. In addition, the manifold inserts may be provided with markings on the outside that allow an operator to discern the specific programming or configuration of the apparatus at a given time.

In an embodiment, the valve may be an electromagnetic valve.

In an embodiment, the valve, during use of the apparatus, may be switchable. A configuration of closed and open channels of the at least two channels with which a respective gas zone 16 is in gas connection may be changeable for changing a function of the gas zone 16 during use.

The valves may be switched during operation to change the configuration of the deposition apparatus 10 during use. This allows an improved control over the composition and sequence of layers that is deposited on a substrate FS and allows any imperfections in the configuration to be removed on the fly during the process. Moreover, it would also allow a single substrate FS to be provided with different stack compositions over a length of the substrate, viewed in the transport direction.

In an embodiment, the deposition apparatus 10 may comprise a controller for controlling the valves during operation.

In an embodiment, the deposition apparatus 10 may comprise an actuator for actuating the axial movement of a said sealing plate 22, 34.

The sealing plates 22, 34 may each or both be moved using an actuator. The actuator may for example be connected to the frame 12.

Several options are available for mounting and moving the sealing plates 22, 34.

In an elaboration, the actuator is a pneumatic actuator or an electromagnetic actuator.

The sealing plates 22, 34 may for example be slidably connected to the frame 12, wherein the sliding movement from and towards the drum 14 may be executed by means of an air cylinder using compressed air. The sliding movement may also be performed by a linear electromagnetic actuator or by using conventional mechanical means, such as electromotors and mechanical transmissions including ball screw spindles, chains and gears and the like.

In an embodiment, the first precursor gas may be a first ALD-precursor gas which is supplied through a precursor gas supply line that is connected to the first sealing plate 22 and the second precursor gas may be a second ALD-precursor gas which is supplied through a precursor gas supply line that is connected to the second sealing plate 34.

By connecting the first and second precursor gasses, which are mutually reactive, to the opposite sealing plates 22, 34, the risk of mixing of precursor gases during opening of or leakage in the sealing plates 22, 34 is reduced. This increases reliability and safety of operation of the deposition apparatus 10. An example of such a configuration is shown in FIG. 10.

In an embodiment, the first ALD precursor gas may be TMA and the second ALD precursor gas may be $H_2O$. The third precursor gas may be a MLD-precursor gas which may be supplied through a precursor gas supply line that is connected to the second sealing plate 34.

With this embodiment, an increased safety and reliability of the deposition apparatus 10 is provided. The TMA and the MLD-precursor gas may be mutually reactive. The risk of residual gases that mix when the sealing plate 22, 34 is opened is substantially prevented by connecting them to the opposite sealing plates 22, 34. An example of such a configuration is shown in FIG. 11.

In an embodiment, of which an example is shown in the figures, the circular segments along which the circular ring channels 26, 38 extend span an angle in the range of 200°-350° (see FIGS. 4A and 4B). The configuration is such that in a corresponding segment 14d of 10°-160° of the cylindrical surface 14a of the drum 14 a supply of gas to the plurality of gas zones 16 is interrupted. This interruption is associated with the segment 14d of the drum which is not covered by the substrate web (see FIG. 2). Thus, loss of gas is substantially prevented.

In an embodiment, a ratio between the ALD process sections and the MLD process sections may be chosen freely.

Depending on the specifications of process, any ratio may be chosen. The deposition apparatus 10 may for example be provided with a cleaning program, in which all gas zones 16 of the number of gas zones 16 are connected to a purge gas source to purge the channels from precursor gases before maintenance or a new process configuration.

While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below. Various embodiments may be applied in combination or may be applied independently from one another. Reference numbers used in the above detailed description are not intended to limit the description of the embodiments to the examples shown in the figures. The figures just represent examples and the embodiments may be embodied in other ways than the specific way shown in the examples of the drawings.

LEGEND

12—frame
14—cylindrical drum
14a—cylindrical drum surface
14b—first end surface
14c—second end surface
14d—segment of the cylindrical drum surface
14e—first end surface plate
14f—second end surface plate
16—gas zone
18—channel of the first plurality of channels
20—opening in the first end surface
22—first sealing plate
22a—sealing side
22b—connection side
24—gas connection openings
26—ring channels
30—closing element
32—channel of the second plurality of channels
33—opening in the second end surface
34—second sealing plate
34a—sealing side
34b—connection side
36—gas connection openings
38—ring channel in second sealing plate
40—substrate guiding assembly
A—central axis
FS—substrate
S—peripheral speed
T—transport speed

The invention claimed is:

1. A deposition apparatus comprising:
a frame; and
a cylindrical drum having a cylindrical surface extending around a central axis and a first and a second end surface extending perpendicularly to the central axis, the drum being rotatably mounted in the frame, the cylindrical drum comprising:
channels extending within the cylindrical drum of which an inlet is connectable to a gas source or an exhaust;
a plurality of gas zones positioned on the cylindrical surface, wherein at least a number of the plurality of gas zones is in gas connection with at least two channels, and wherein a number of the gas zones of the plurality of gas zones are configured to either supply a gas to or exhaust a gas from the cylindrical surface; and
closing elements for closing off all but one of the at least two channels with which a said gas zone of the number of the plurality of gas zones is in gas connection;
wherein by selectively closing off, with the closing elements, all but one of the channels for each gas zone of the number of the plurality of gas zones, the function of the gas zone is selectively set to be a gas exhaust zone or a gas supply zone in which a type of gas that is supplied is selectively set, so that a sequence of deposition and a composition of a stack of deposited layers is programmable.

2. The deposition apparatus according to claim 1, wherein the channels include at least a first plurality of channels extending within the drum from the first end surface to associated ones of the plurality of gas zones, wherein each channel forms an opening in the first end surface, the deposition apparatus further comprising:
a first sealing plate having a sealing side and a connection side which is opposite the sealing side, wherein the first sealing plate includes:
gas connection openings in the connection side to which gas supply lines and/or gas exhausts lines are connectable; and
at least a number of ring channels which extend in the sealing side along a circular segment of which a midpoint coincides with the central axis of the drum, wherein each ring channel is fluidly connected to an associated gas connection opening wherein each ring channel is in gas connection with at least one opening in the first end surface,
wherein at least a number of the plurality of gas zones is in gas connection with at least two channels of the first plurality of channels, the deposition apparatus including closing elements for closing off all but one of the at least two channels with which a said gas zone of the number of the plurality of gas zones is in gas connection.

3. The deposition apparatus according to claim 2, wherein the sealing plate is moveable from a seal position in which the sealing side is positioned against the first end surface and a remote position in which the sealing plate is moved away from the first end surface.

4. The deposition apparatus according to claim 3, comprising an actuator for executing the axial movement of a said sealing plate.

5. The deposition apparatus according to claim 4, wherein the actuator is a pneumatic actuator or an electromagnetic actuator.

6. The deposition apparatus according to claim 2, wherein the channels include a second plurality of channels extending within the drum from the second end surface to associated ones of the plurality of gas zones, wherein each channel forms an opening in the second end surface and wherein the apparatus comprises:
- a second sealing plate having a sealing side and a connection side which is opposite the sealing side, wherein the second sealing plate includes:
  - gas connection openings in the connection side to which gas supply lines and/or gas exhaust lines are connectable; and
  - at least a number of ring channels which extend in the sealing side along a circular segment of which a midpoint coincides with the central axis of the drum, wherein each ring channel is fluidly connected to an associated gas connection opening wherein each ring channel is in gas connection with at least one opening in the second end surface,
- wherein at least a number of the plurality of gas zones is in gas connection with at least two channels of the first and/or the second plurality of channels, the deposition apparatus including closing elements for closing off all but one of the at least two channels with which a said gas zone of the number of the plurality of gas zones is in gas connection.

7. The deposition apparatus according to claim 6, wherein the second sealing plate is moveable from a seal position in which the sealing side is positioned against the second end surface and a remote position in which the second sealing plate is moved away from the second end surface.

8. The deposition apparatus according to claim 2, wherein the circular segments along which the ring channels extend span an angle in the range of 200.degree.-350.degree. so that in a corresponding segment of 10.degree.-160.degree. of the cylindrical surface of the drum a supply of gas to the plurality of gas zones is interrupted.

9. The deposition apparatus according to claim 1, wherein:
- a first subset of the plurality of gas zones is connected to a first precursor gas source to form a first precursor gas zone;
- a second subset of the plurality of gas zones is connected to a second precursor gas source to form a second precursor gas zone;
- a third subset of the plurality of gas zones is connected to a purge gas source to form a purge gas zone;
- a fourth subset of the plurality of gas zones is connected to an exhaust to form a gas exhaust zone; and
- a fifth subset of the plurality of gas zones is connected to a third precursor gas source to form a third precursor gas zone,
- wherein the first and the second precursor gases are associated with atomic layer deposition and the first and the third precursor gases are associated with molecular layer deposition.

10. The deposition apparatus according to claim 9, wherein each of the at least two channels of a gas zone of said number of gas zones is in gas connection with a different one of the first precursor gas source, the second precursor gas source, the third precursor gas source, the purge gas source or the exhaust.

11. The deposition apparatus according to claim 9, wherein, during use, an arrangement of gas zones on the cylindrical surface, when viewed in the direction of rotation, at least comprises process sections for ALD and process sections for MLD, wherein each process section successively comprises a purge gas zone, a gas exhaust zone, a precursor gas zone, and a gas exhaust zone.

12. The deposition apparatus according to claim 11, wherein, in use, the purge gas is supplied so that the purge gas zones provide a gas bearing to floatingly support the substrate.

13. The deposition apparatus according to claim 9, wherein:
- the first precursor gas is a first ALD-precursor gas which is supplied through a precursor gas supply line that is connected to the first sealing plate; and
- the second precursor gas is a second ALD-precursor gas which is supplied through a precursor gas supply line that is connected to the second sealing plate.

14. The deposition apparatus according to claim 13, wherein:
- a first subset of the plurality of gas zones is connected to a first precursor gas source to form a first precursor gas zone;
- a second subset of the plurality of gas zones is connected to a second precursor gas source to form a second precursor gas zone;
- a third subset of the plurality of gas zones is connected to a purge gas source to form a purge gas zone;
- a fourth subset of the plurality of gas zones is connected to an exhaust to form a gas exhaust zone; and
- a fifth subset of the plurality of gas zones is connected to a third precursor gas source to form a third precursor gas zone,
- wherein the first and the second precursor gases are associated with atomic layer deposition and the first and the third precursor gases are associated with molecular layer deposition, and
- wherein the first precursor gas also has the function of being a first MLD-precursor gas and wherein the third precursor gas is a second MLD-precursor gas which is supplied through a precursor gas supply line that is connected to the second sealing plate.

15. The deposition apparatus according to claim 13, wherein the first ALD precursor gas is TMA, the second ALD precursor gas is $H_2O$.

16. The deposition apparatus according to claim 1, wherein:
- a first subset of the plurality of gas zones is connected to a first precursor gas source to form a first precursor gas zone;
- a second subset of the plurality of gas zones is connected to a second precursor gas source to form a second precursor gas zone;
- a third subset of the plurality of gas zones is connected to a purge gas source to form a purge gas zone;
- a fourth subset of the plurality of gas zones is connected to an exhaust to form a gas exhaust zone;
- a fifth subset of the plurality of gas zones is connected to a third precursor gas source to form a third precursor gas zone; and
- a sixth subset of the plurality of gas zones is connected to a fourth precursor gas source to form a fourth precursor gas zone,
- wherein the first and the second precursor gases are associated with atomic layer deposition for depositing a first atomic layer and the third and fourth precursor gases are associated with atomic layer deposition for depositing a second atomic layer or with molecular layer deposition for depositing a molecular layer.

17. The deposition apparatus according to claim 16, wherein each of the at least two channels of a gas zone of said number of gas zones is in gas connection with a different one of the first precursor gas source, the second precursor gas source, the third precursor gas source, the purge gas source or the fourth precursor gas source.

18. The deposition apparatus according to claim 1, including a substrate guiding assembly for guiding a flexible substrate around a substantial circumferential portion of the drum with a substrate transport speed, wherein, in use, the rotational speed of the drum provides a peripheral velocity to the cylindrical surface of the drum which is different from the substrate transport speed.

19. The deposition apparatus according to claim 18, wherein the peripheral velocity of the cylindrical surface is at least 5 times higher than the transport speed of the substrate.

20. The deposition apparatus according to claim 18, wherein, in use, direction of movement of the substrate is opposite to the direction of movement of the cylindrical surface.

21. The deposition apparatus according to claim 1, wherein at least one of the closing elements is a removable plug that is insertable in a channel for closing off said channel.

22. The deposition apparatus according to claim 1, wherein at least one of the closing elements is a valve.

23. The deposition apparatus according to claim 22, wherein the valve is an electromagnetic valve.

24. The deposition apparatus according to claim 22, wherein the valve, during use of the apparatus, is switchable, such that a configuration of closed and open channels of the at least two channels with which a respective gas zone is in gas connection is changeable for changing a function of the gas zone during use.

25. The deposition apparatus according to claim 22 comprising a controller for controlling the valves during operation.

26. The deposition apparatus according to claim 1, wherein the closing elements are embodied as replaceable manifold inserts.

27. The deposition apparatus according to claim 26, wherein the drum includes:
drum segments which define the cylindrical drum surface, wherein each of the channels includes a first part that extends within the drum segments; and
a first and a second end surface plate which define the first and the second end surface respectively, wherein each of the channels includes a second part that extends within an associated end surface plate in a substantial radial direction from a gas opening in the associated end surface to a peripheral edge of said end surface plates,
wherein the manifold inserts are connectable to the peripheral edges of the end surface plates and/or to the drum segments, wherein the manifold inserts are provided with at least one passage, wherein the at least one passage includes an end that is fluidly connectable to the first part of a channel and an opposite end that is fluidly connectable to the second part of a channel.

28. A method for applying layers on a substrate, the method comprising the steps of:
providing the apparatus according to claim 1;
selectively closing off all but one of the channels for each gas zone, so that each gas zone is supplied with a single selected gas or, alternatively exhausted;
guiding a substrate around a part of the circumference of the cylindrical drum and create a relative movement between the substrate and the drum;
supplying the respective gases to the associated selected gas zones; and
exhausting gas from the associated selected gas zones of the plurality of gas zones.

* * * * *